(12) United States Patent
Bharathan

(10) Patent No.: US 9,983,246 B2
(45) Date of Patent: May 29, 2018

(54) QUASI-DIFFERENTIAL MUTUAL CAPACITANCE MEASUREMENT

(71) Applicant: Cypress Semiconductor Corporation, San Jose, CA (US)

(72) Inventor: Vibheesh Bharathan, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days. days.

(21) Appl. No.: 15/405,047

(22) Filed: Jan. 12, 2017

(65) Prior Publication Data

US 2017/0205453 A1    Jul. 20, 2017

Related U.S. Application Data

(60) Provisional application No. 62/279,078, filed on Jan. 15, 2016.

(51) Int. Cl.
*G06F 3/045* (2006.01)
*G01R 27/26* (2006.01)
*G06F 3/044* (2006.01)

(52) U.S. Cl.
CPC ......... *G01R 27/2605* (2013.01); *G06F 3/044* (2013.01)

(58) Field of Classification Search
CPC ............................ G01R 27/2605; G06F 3/044
See application file for complete search history.

(56) References Cited

U.S. PATENT DOCUMENTS

| | | | |
|---|---|---|---|
| 8,547,114 B2 | 10/2013 | Kremin | |
| 8,575,947 B1 | 11/2013 | Walsh et al. | |
| 8,624,870 B2 | 1/2014 | Joharapurkar et al. | |
| 8,779,783 B1* | 7/2014 | Liepold | G06F 3/016 324/658 |
| 9,310,924 B2 | 4/2016 | Hanssen et al. | |
| 9,310,953 B1 | 4/2016 | Maharyta | |
| 9,442,146 B2 | 9/2016 | Kremin et al. | |
| 2011/0227633 A1* | 9/2011 | Mo | H02M 3/07 327/517 |
| 2012/0043971 A1* | 2/2012 | Maharyta | G01R 27/2605 324/658 |
| 2013/0038476 A1 | 2/2013 | Pedersen | |
| 2013/0141139 A1* | 6/2013 | Ballan | H03K 17/962 327/51 |
| 2013/0257745 A1* | 10/2013 | Reynolds | G06F 3/041 345/173 |
| 2014/0078096 A1 | 3/2014 | Tan et al. | |

(Continued)

OTHER PUBLICATIONS

Cypress Semiconductor Corporation, "PSoC 4 Capacitive Sensing (CapSense®)", May 4, 2016, 30 pages.

(Continued)

*Primary Examiner* — Erin M File

(57) ABSTRACT

A circuit, system, and method for converting mutual capacitance to a digital value is described. Charge packets are transferred from a mutual capacitance to a pair of integration capacitors during alternate charge and discharge cycles. The time required to bring the discharged integration capacitor to the same potential as the charged integration capacitor with a current source is measured as a single-slope analog-to-digital converter (ADC). The output of the ADC is representative of the mutual capacitance.

20 Claims, 10 Drawing Sheets

(56) References Cited

U.S. PATENT DOCUMENTS

2016/0003881 A1 1/2016 Ogirko et al.
2018/0004347 A1* 1/2018 Guedon ................ G06F 3/0418

OTHER PUBLICATIONS

International Search Report for International Application No. PCT/US17/13457 dated Apr. 14, 2017 ; 2 pages.
Written Opinion of the International Searching Authority for International Application No. PCT/US17/13457 dated Apr. 14, 2017; 7 pages.

* cited by examiner

| Switch | Initialization | Integration PH1 | Integration PH2 | Digitization |
|---|---|---|---|---|
| 101 | 0 | 0 | 1 | 0 |
| 102 | 0 | 1 | 0 | 0 |
| 121 | 1 | 1 | 0 | 0 |
| 122 | 1 | 0 | 1 | 0 |
| 123 | 1 | 0 | 0 | 0 |
| 137 | 0 | 0 | 0 | 1 |

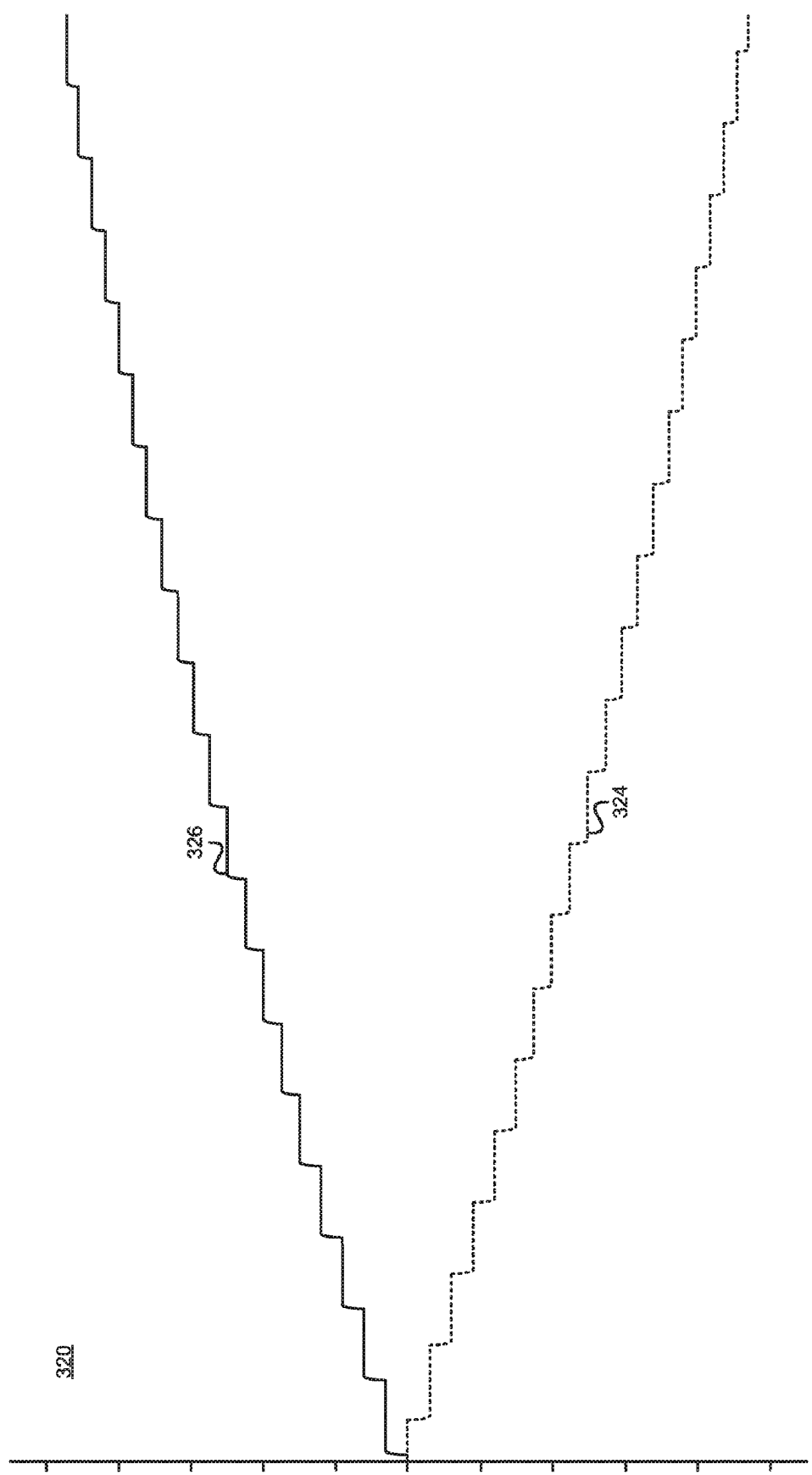

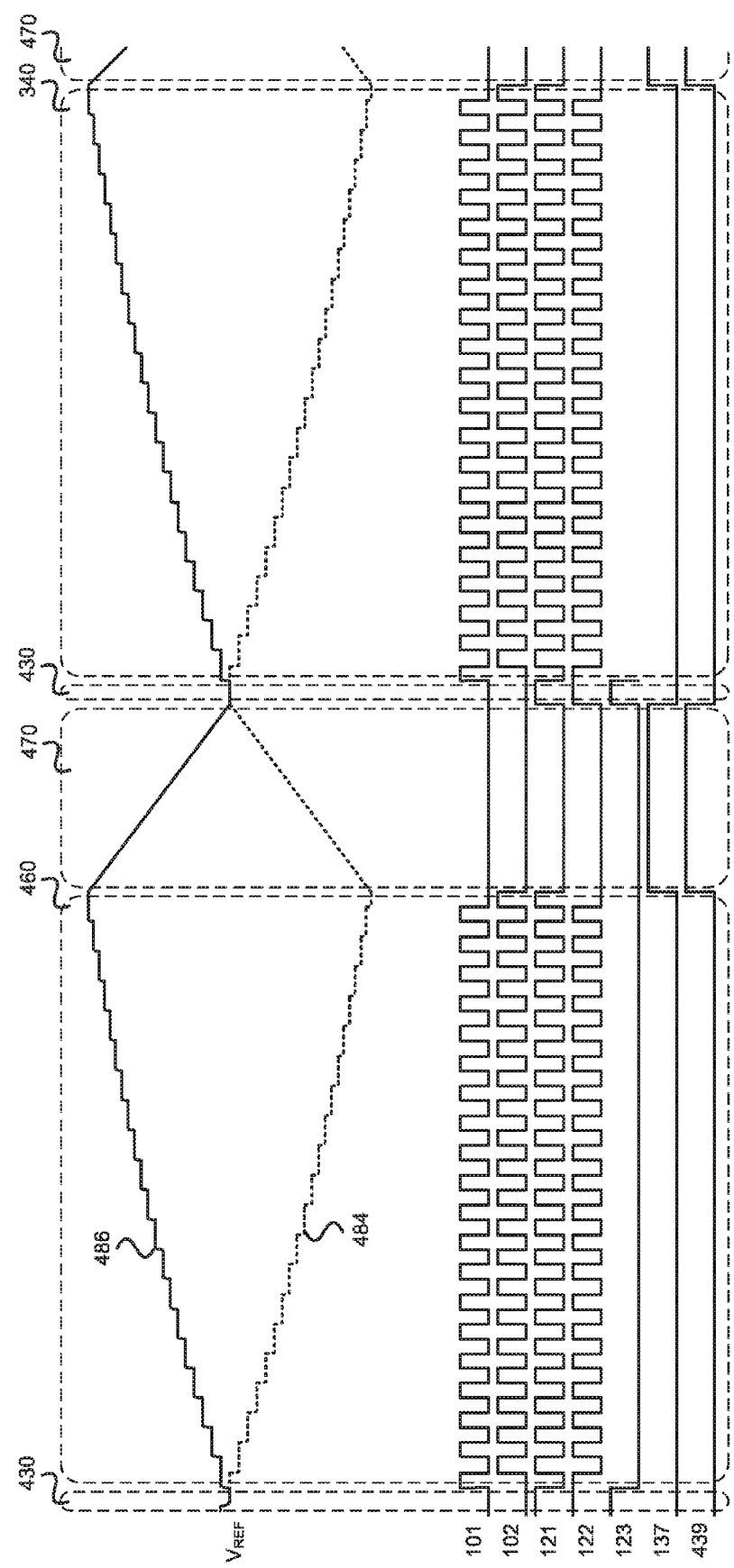

US 9,983,246 B2

QUASI-DIFFERENTIAL MUTUAL CAPACITANCE MEASUREMENT

RELATED APPLICATIONS

This patent application claims the benefit of U.S. Provisional Patent Application No. 62/279,078, filed Jan. 15, 2016, which is incorporated by reference herein in its entirety.

TECHNICAL FIELD

The present disclosure relates generally to sensing systems, and more particularly to capacitance-sensing systems configurable to measure self capacitance or convert mutual capacitance to digital values representative of the capacitance.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Arrays of capacitive sense elements work by measuring the capacitance of a capacitive sense element, and looking for a delta (change) in capacitance indicating a touch or presence of a conductive object. When a conductive object (e.g., a finger, hand, or other object) comes into contact with or close proximity to a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and some touch solutions sense both capacitances either uniquely or in hybrid form with its various sense modes.

DESCRIPTION OF THE DRAWINGS

FIG. 3B illustrates charge voltage accumulated or integrated on integration capacitors of a capacitance measurement circuit, according to one embodiment.

FIG. 4C illustrates voltages on integration capacitors according to various switch states of a capacitance measurement circuit dual current sources for dual slope analog-to-digital conversion, according to one embodiment.

DETAILED DESCRIPTION

Figure 1:
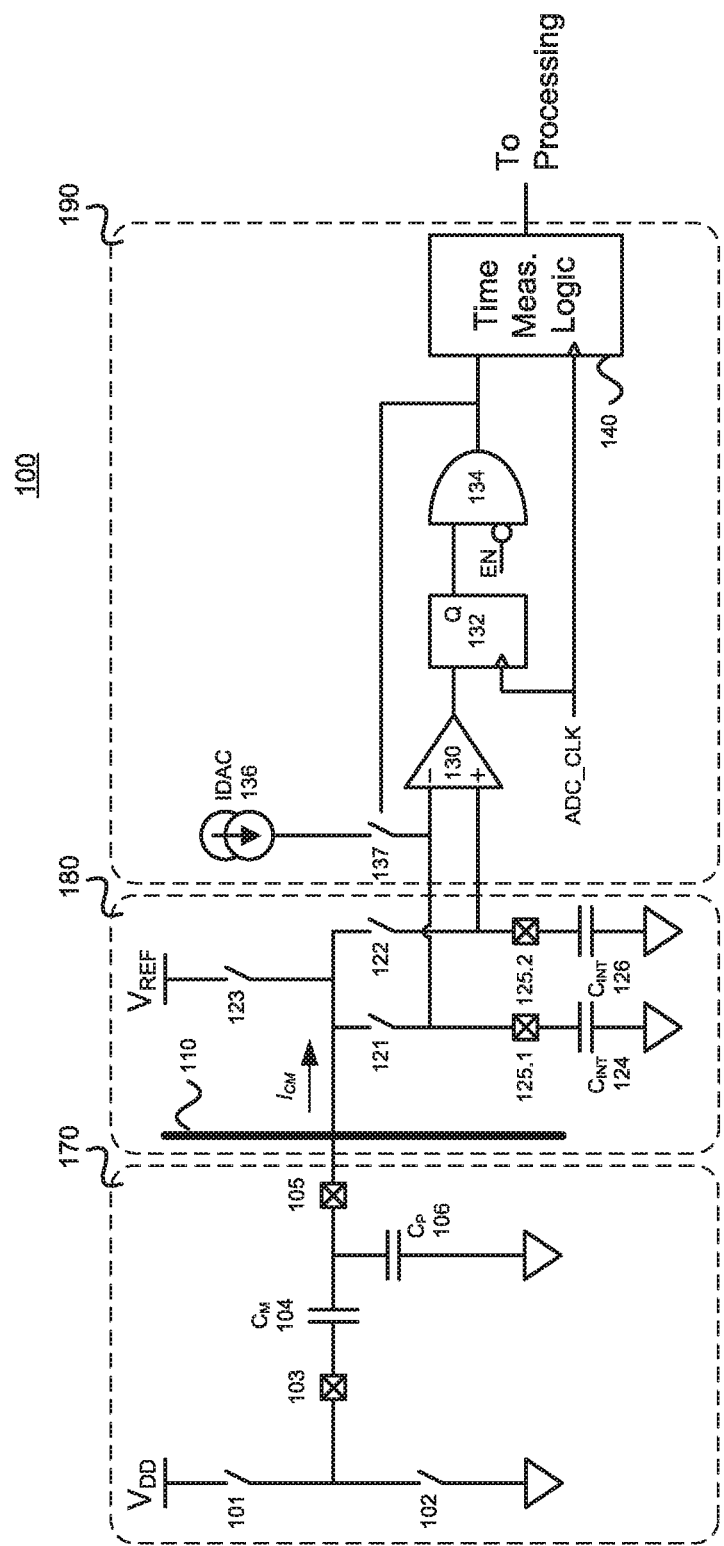
FIG. 1 illustrates a capacitance measurement circuit, according to one embodiment.

FIG. 1 illustrates a mutual capacitance measurement circuit 100 with quasi-differential measurement. Mutual capacitance measurement circuit 100 may include a mutual capacitance circuit 170. Mutual capacitance circuit 170 may include a pair of switches, 101 and 102, coupled between a transmit (TX) pin 103 and a power supply and ground. TX pin 103 may be coupled to a first electrode of mutual capacitance ($C_M$) 104 such that a TX signal generated by the alternating closures of switches 101 and 102 is applied to the first electrode. A second electrode of $C_M$ 104 may be coupled to a receive (RX) pin 105. The second electrode of $C_M$ 104 may be configured to receive a signal derived from the transmit signal applied to the first electrode of $C_M$ 104. RX pin 105 may be coupled to an integration circuit 180. A parasitic capacitance ($C_P$) 106 may exist between the second electrode, the RX pin, and the circuitry between RX pin and integration circuit 180. $C_P$ 106 is not altered by the presence of a conductive object, but may still change and affect measurement; it is present on the circuit regardless of the state of the sensor.

Integration circuit 180 may include a pair of integration capacitors 124 and 126 coupled to pins 125.1 and 125.2. Integration circuit 180 may include a pair of switches 121 and 122 coupled between integration capacitors 124 and 126 and RX pin 105. In one embodiment, RX pin 105 may be coupled to an analog multiplexor (AMUX) 110, which is coupled to integration circuit 180. In this embodiment, a single integration circuit may be used to measure multiple mutual capacitances that may exist between several electrodes of an array. In another embodiment, separate integration circuits may be assigned to each mutual RX pin. In this embodiment, more circuits may be necessary, but simultaneous measurement of multiple mutual capacitances may be possible. In still other embodiments, different combinations of RX pins and integration circuits may be implemented, including different numbers of RX pins assigned to integration circuits.

Integration circuit 180 may include a reference voltage, $V_{REF}$, coupled to integration capacitors 124 and 126 through switch 123, switches 121 and 122, and pins 125.1 and 125.2. In one embodiment, $V_{REF}$ may be used to apply a known voltage to both integration capacitors 124 and 126 during an initialization phase. In various embodiments, different voltages may be used as $V_{REF}$. In one embodiment, $V_{REF}$ may be a bandgap voltage. In other embodiments, $V_{REF}$ may be divided down from the power supply voltage ($V_{DD}$), be a defined voltage of an integrated circuit, or be provided from an external power supply through an input pin of an integrated circuit including capacitance measurement circuit 100. Integration capacitors 124 and 126 may be coupled to a digitization circuit 190 through negative and positive inputs of comparator 130.

Comparator 130 of digitization circuit 190 may have an output coupled to D flip-flop 132 which may be used to avoid synchronization issues between analog components (such as comparator 130) and digital components used in the digitization of the capacitance on integration capacitors 124 and 126. AND gate 134 may enable or disable the digitization of the capacitance on integration capacitors 124 and 126 by controlling (enabling) time measurement logic 140 and switch 137. Switch 137, when closed may provide a current from current digital-to-analog converter (IDAC) 136 for charging integration capacitor 124. Unless "EN" is active high, time measurement logic 140 does not receive a signal from comparator 130 (through D flip-flop 132 and AND gate 134). As EN is active high only during the digitization phase, time measurement logic 140 does not receive signals during the integration and initialization phases.

In various embodiments, IDAC 136 may be fixed or programmable. In still other embodiments, IDAC 136 may be implemented a fixed current source through a resistor or as switched capacitor network. In an embodiment of a switched capacitor network, the current may be controlled by controlling the switching frequency of the switched capacitor.

In one embodiment, integration capacitors 124 and 126 may be disposed external to an integrated circuit including the switches and digitizing elements of mutual capacitance measurement circuit 100. In this embodiment, integration capacitors are coupled to the mutual capacitance measurement circuit 100 through pin 125.1 and 125.2. In another embodiment, integration capacitors 124 and 126 are part of the integration circuit and are implemented in silicon. In this embodiment, integration capacitors 124 and 126 are not coupled to pins 125.1 and 125.2 as they are already coupled to the mutual capacitance measurement circuit that exist in silicon.

The output of time measurement logic 140 may be passed to processing logic that may be used to compare mutual capacitance measured at a first time to that measured at a second time or to a baseline capacitance. Processing logic may be used to determine if a conductive object is present on or in proximity to electrodes that form $C_M$ 104. Processing logic may be on a separate device as capacitance measurement circuit 100, or it may be implemented as part of an integration circuit that also includes capacitance measurement circuit 100. This is discussed with regard to FIG. 6.

FIG. 2 illustrates a simplified flowchart 200 of operation of capacitance measurement circuit 100. In step 210, capacitance measurement circuit 100 may be initialized. Initialization may include the application of $V_{REF}$ to integration capacitors 124 and 126 by closing switches 121, 122, and 123 and leaving open all other switches of capacitance measurement circuit 100. Switches 121, 122, and 123 remain closed long enough to charge both integration capacitors 124 and 126 to $V_{REF}$. In other embodiments, initialization of capacitance measurement circuit 100 may charge integration capacitors 124 and 126 through a constant current source or a resistor network. One of ordinary skill in the art would understand that there are several ways of charging integration capacitors 124 and 126 and those methods listed here are not intended to be limiting. In one embodiment, integration capacitors 124 and 126 could be discharged to ground and then charged with IDAC 136 for a specific duration (switches 121, 122, and 137 closed for a specified number of clock cycles). In this embodiment, integration capacitors 124 and 126 would be charged to a known voltage. In this embodiment, at least one switch may be required to discharge integration capacitors 124 and 126 to ground.

In step 220, charge may be integrated on integration capacitors 124 and 126 from mutual capacitance circuit 170. Switch 123 is first opened, disconnecting integration capacitors 124 and 126 from $V_{REF}$. Then the pairs of switches (101/122 and 102/121) are alternative opened and closed, generating positive and negative currents on RX pin 105 and charging and discharging integration capacitors 126 and 124, respectively. After a certain number of phases or clock signals, the integration of step 220 is stopped and the measurement process proceeds to step 230.

In step 230, the charge that has been accumulated on integration capacitors 124 and 126 is converted to a digital value. A timer of time measurement logic 140 is started and switch 137 is closed. The closure of switch 137 couples IDAC 136 to integration capacitor 124. Integration capacitor 124 is charged by IDAC 137 until the voltage across it is equal to the voltage across integration capacitor 126. When the voltages across integration capacitors 124 and 126 are equal, the output of comparator 130 opens switch 137 and stops the timer of time measurement logic 140. The value of the timer of time measurement logic 140 corresponds to the amount of time necessary to charge integration capacitor 124 to the same voltage as integration capacitor 126 and is representative of the capacitance value of $C_M$ 104 between the first electrode coupled to TX pin 103 and the second electrode coupled to RX pin 105.

In another embodiment, an IDAC may be coupled to integration capacitor 126 and configured to discharge integration capacitor 126 to the voltage on integration capacitor 124. The time necessary to discharge integration capacitor 126 to the same voltage on integration capacitor 124 is representative of the capacitance value of $C_M$ 104 between the first electrode coupled to TX pin 103 and the second electrode coupled to RX pin 105.

Figures 2A, 2B:
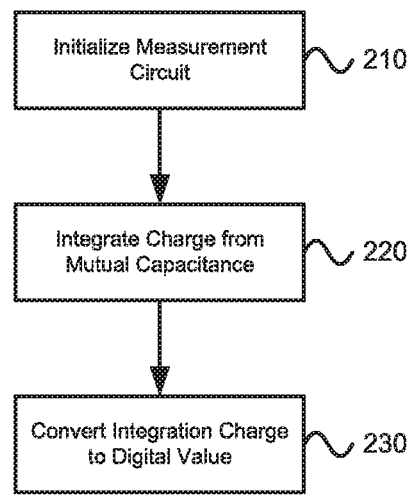
FIG. 2A illustrates a method for operating a capacitance measurement circuit, according to one embodiment.
FIG. 2B illustrates switch control states for switches of a capacitance measurement circuit, according to one embodiment.

FIG. 2B illustrates the switch states for each of the initialization, integration, and digitization steps of FIG. 2A. Switches 101/122 and 102/121 controlled by a non-overlapping clock and are 180 degrees out of phase of each other.

Figure 3A:
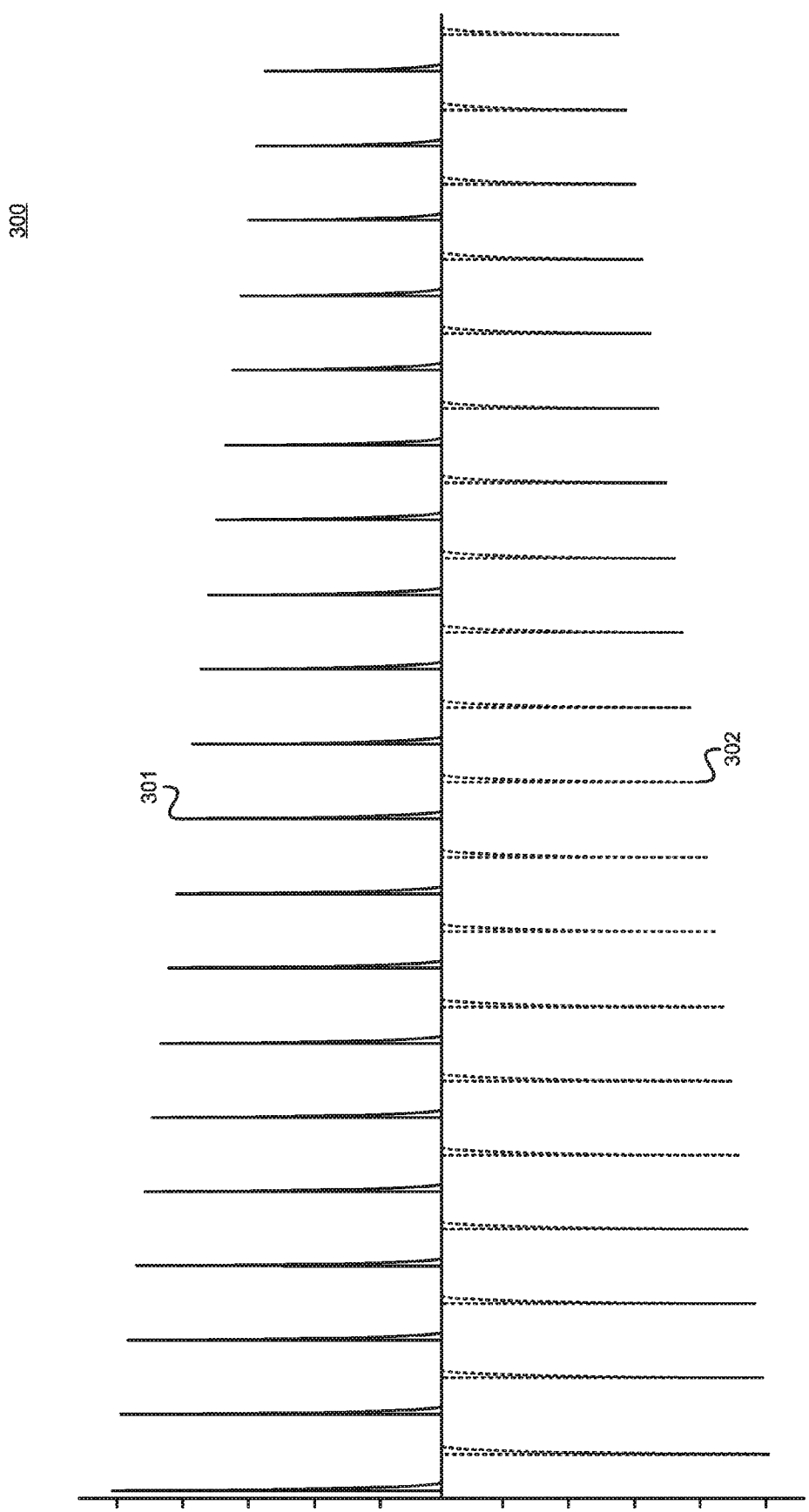
FIG. 3A illustrates charge packets applied to integration capacitors of a capacitance measurement circuit, according to one embodiment.

FIG. 3A illustrates charge packets that are integrated onto integration capacitors 124 and 126 from the transmit and receive operation of mutual capacitance circuit 170. Transmit and receive operation and the resultant charge packets are described below with regard to FIGS. 2B, and 3A-C. Positive charge packets are illustrated by waveform 301 as they are produced from the PH1 clock and integrated onto integration capacitor 126. Negative charge packets are illustrated by waveform 301 as they are produced from the PH2 clock and integrated onto integration capacitor 124. A charge packet may be understood to be a quantized amount of charge. The integration of positive charge packets of waveform 301 increases the voltage on integration capacitor 126. The integration of negative charge packets of waveform 302 decreases the voltage on integration capacitor 124.

FIG. 3B illustrates the voltages on integration capacitors 124 and 126 through operation of integration circuit 180. The result of the operation of integration circuit 180 is that voltage 326 on integration capacitor 126 increases and voltage 324 on integration capacitor 124 decreases. The voltages on integration capacitors 124 and 126 are decreased and increased respectively by values proportional to the capacitance value of $C_M$ 104

Figure 3C:
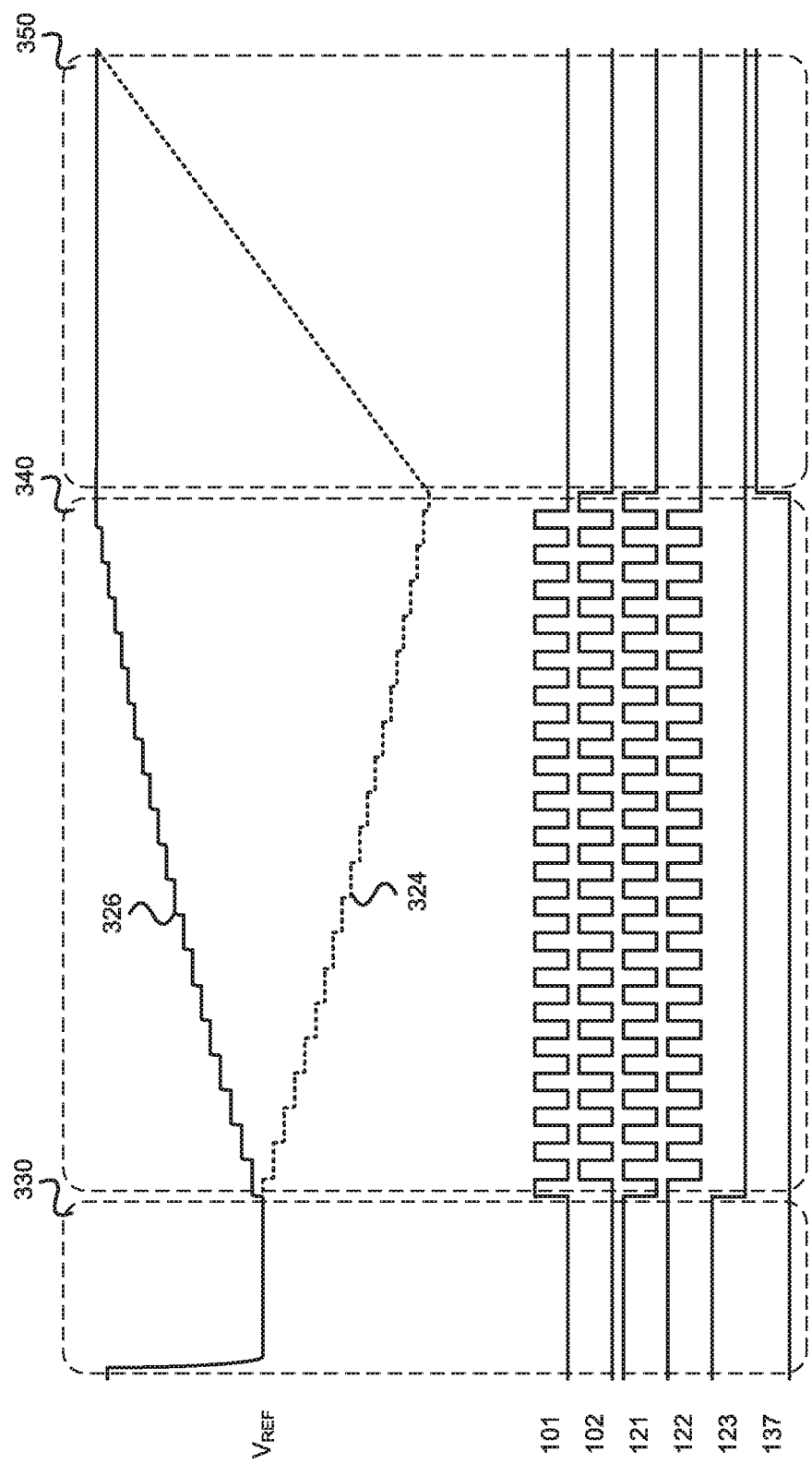
FIG. 3C illustrates voltages on integration capacitors according to various switch states of a capacitance measurement circuit, according to one embodiment.

FIG. 3C illustrates the voltages on integration capacitors 124 and 126 through the entire operation of the capacitance measurement circuit, including the initialization phase (330), the integration phase (340), and the digitization phase (350). The switch states for each switch of FIG. 1 for each phase are illustrated as a graphical representation of FIG. 2B. During initialization phase 340, switches 121, 122, and 123 are closed and the voltages 324 and 326 on integration capacitors 124 and 126 are set to $V_{REF}$. During the integration phase, switches 123 and 137 are opened and switches 101/122 and 102/121 are alternately opened and closed to increase and decrease the voltages 326 and 324 on integration capacitors 126 and 124, respectively. At the beginning of digitization phase 350, the timer of time measurement logic 140 is started. During digitization phase 350, all switches are opened except for switch 137, which couples IDAC 136 to integration capacitor 124 and charges integration capacitor 124 to the same voltage as integration capacitor 126, at which time comparator 130 is tripped and the timer of time measurement logic 140 is stopped Digitization phase 350 may be understood to be a single-slope analog-to-digital conversion.

Figure 4A:
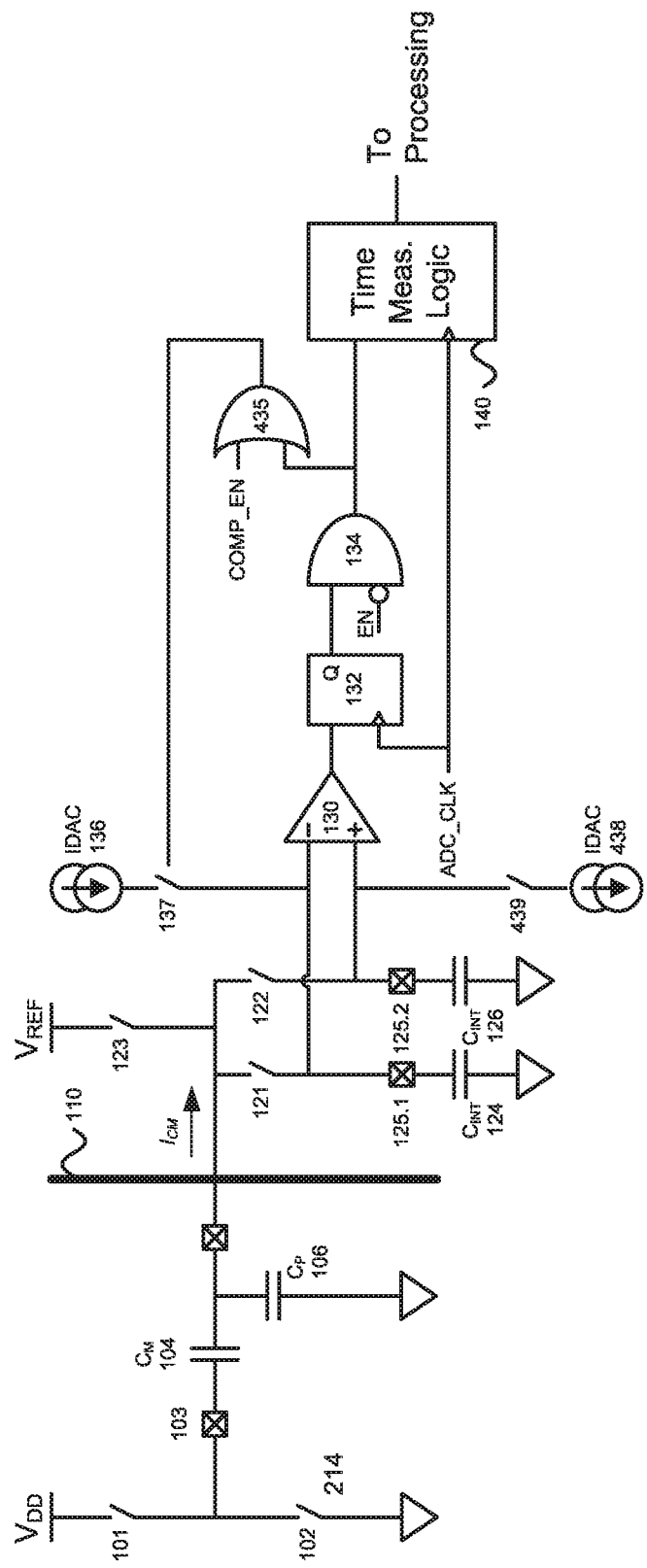
FIG. 4A illustrates a capacitance measurement circuit with improved compensation, according to one embodiment.

FIG. 4A illustrates an embodiment of a mutual capacitance measurement circuit 400 with quasi-differential measurement that may be used with a value of $C_M$ 104 that is large enough to charge and discharge integration capacitors 126 and 124 outside the rails (e.g., $V_{DD}$ and ground) during the integration phase. In this scenario, the small changes to $C_M$ 104 that occur in the presence of a conductive object may not be easily detected.

IDAC 438 may be coupled to integration capacitor 126 through switch 439 to bleed charge off of integration capacitor 126 during the integration phase. IDAC 136 may provide current to integration capacitor 124 through switch 137 to match the current applied to integration capacitor 126 from IDAC 438. The compensation currents from IDACs 136 and 438 may prevent integration capacitors 126 and 124, respectively, from saturating to the rails.

In various embodiments, IDAC 438 may be fixed or programmable. In still other embodiments, IDAC 438 may be implemented a fixed current source through a resistor or as switched capacitor network. In an embodiment of a switched capacitor network, the current may be controlled by controlling the switching frequency of the switched capacitor.

Figure 4B:
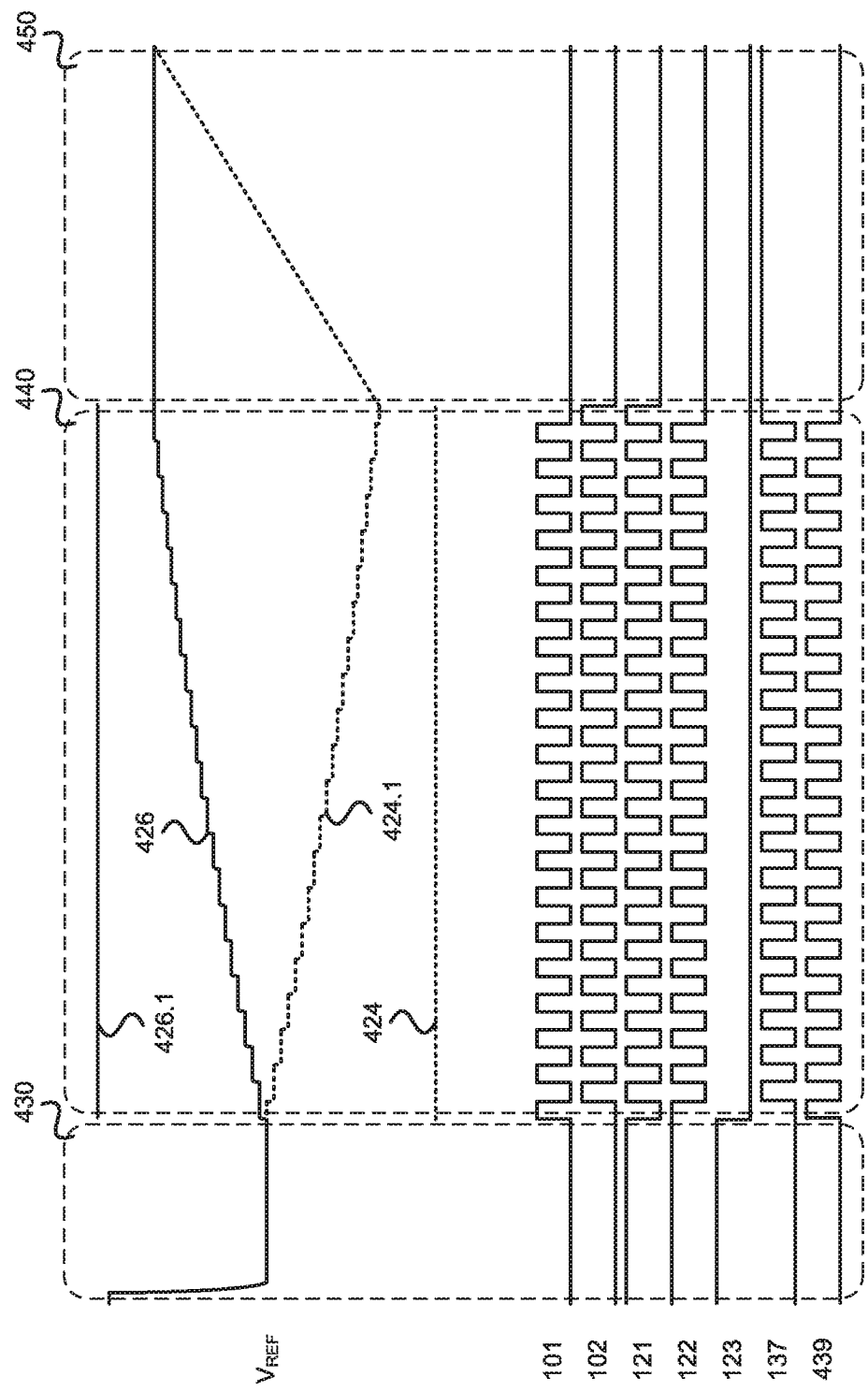
FIG. 4B illustrates voltages on integration capacitors according to various switch states of a capacitance measurement circuit with improved compensation, according to one embodiment.

FIG. 4B illustrates the voltages on integration capacitors 124 and 126 through the entire operation of the capacitance measurement circuit 400 of FIG. 4, including the initialization phase (430), the integration phase (440), and the digitization phase (450). The states of each switch of capacitance measurement circuit 400 are also illustrated. Initialization phase 430 operates the same as initialization phase 330 of FIG. 3. Switches 121, 122, and 123 are closed, providing a voltage ($V_{REF}$) to integration capacitors 124 and 126. As with capacitance measurement circuit 100 of FIG. 1, different voltages may be used as $V_{REF}$. In one embodiment, $V_{REF}$ may be a bandgap voltage. In other embodiments, $V_{REF}$ may be divided down from the power supply voltage ($V_{DD}$), be a defined voltage of an integrated circuit, or be provided from an external power supply through an input pin of an integrated circuit including capacitance measurement circuit 400.

Integration phase 440 may also operate similar to integration phase 340 of FIG. 340. However, in the embodiment with compensation currents, switches 137 and 439 may be alternately closed and open with switches 101/122 and 102/121 to provide additional charge to integration capacitor 124 and bleed off charge from integration capacitor 126. This is shown by the voltages 424 and 426, which are the result of the compensation current acting in concert with the integration of charge packets (as described with regard to FIGS. 1 and 3A above). Voltage levels 424.1 and 426.1 represent the voltages that would be reached by operation of capacitance measurement circuit 400 without the operation of compensation IDACs 136 and 438. The voltage 426 on integration capacitance 126 is lower than voltage 426.1. The voltage 424 on integration capacitor 124 is higher than voltage 424.1.

The operation of digitization phase 450 is similar to digitations phase 350 of FIG. 3C (as described for capacitance measurement circuit 100 of FIG. 1). In one embodiment, the single-slope analog-to-digital conversion may take less time as the difference between voltage 424 on integration capacitor 124 and voltage 426 on integration capacitor 126 is less. This may lead to faster measurement times, but the operation of compensation IDACs 136 and 438 may also keep voltages 424 and 426 away from the rails, ground and $V_{DD}$, respectively.

Capacitance measurement circuit 400 may also operate in a dual-slope mode my using both IDAC 136 and IDAC 438 during the digitization phase. Voltages on integration capacitors 124 and 126 are illustrated in FIG. 4C. Voltage 484 represents the voltage on integration capacitor 124 during operation of capacitance measurement circuit 400 in dual-slope mode. Voltage 486 represents the voltage on integration capacitor 126 during operation of capacitance measurement circuit 400 in dual-slope mode. Initialization phase 430 operates in a similar manner as initialization phase 170 of FIG. 3C. Switches 121, 122, and 123 are closed so that a reference voltage, $V_{REF}$, can be coupled to integration capacitors 124 and 126. As with capacitance measurement circuit 100 of FIG. 1, different voltages may be used as $V_{REF}$. In one embodiment, $V_{REF}$ may be a bandgap voltage. In other embodiments, $V_{REF}$ may be divided down from the power supply voltage ($V_{DD}$), be a defined voltage of an integrated circuit, or be provided from an external power supply through an input pin of an integrated circuit including capacitance measurement circuit 400. Integration phase 460 may operate similar to integration phase 340 of FIG. 3C, as implemented by capacitance measurement circuit 100 of FIG. 1. Digitization phase 470 may operate by closing switches 137 and 439 and charging and discharging integration capacitors 424 and 426, respectively. As the voltages on integration capacitors 424 and 426 come together, comparator 130 may be tripped and the timer of time measurement logic 140 may be stopped, just as in digitization phase 350 of FIG. 3C. In this embodiment, digitization phase may be faster as the voltage at which comparator 130 trips is approximately halfway between the voltage that results at the end of integration phase 460. Circuit and process variations may result on the voltage that trips comparator 130 being slight higher or lower than the initialization voltage ($V_{REF}$). Additionally, initialization phase 430 may be shorter as the voltage on integration capacitors 124 and 126 may be settled to $V_{REF}$ from a voltage that is much closer to $V_{REF}$, resulting in a faster settling time.

In another embodiment, IDACs 136 and 438 may operate during integration phase 460 to generate a compensation signal, as described in with regard to FIG. 4B, as well as during digitization phase 470. In this embodiment, compensation and dual-slope digitization may be realized.

Figures 5A, 5B:
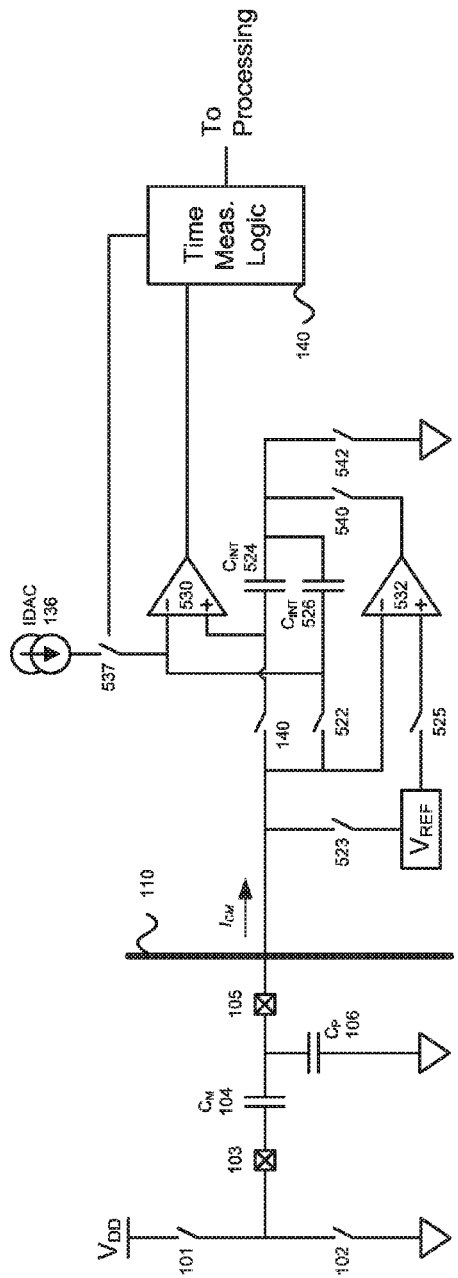
FIG. 5A illustrates a capacitance measurement circuit with constant voltage applied to a parasitic capacitance, according to one embodiment.
FIG. 5B illustrates various switch states of a capacitance measurement circuit with constant voltage applied to a parasitic capacitance, according to one embodiment.

FIG. 5A illustrates an embodiment of a mutual capacitance measurement circuit 500 with quasi-differential measurement that holds the voltage on $C_P$ 106 constant, thereby reducing the measurement's sensitivity to $C_P$ 106. During an initiation phase, reference voltage $V_{REF}$ may be applied to integration capacitors 524 and 526 by closing switches 521, 522, 523 and 542. Switches 521, 522, and 523 correspond to switches 121, 122, and 123 of FIG. 1. Switch 542 provides a connection to a ground potential for integration capacitors 524 and 526 during initialization.

During the integration phase, the charging/discharging mechanism for integration capacitors 524 and 526 is similar as that for integration capacitors 124 and 126 of FIG. 1. However, integration capacitors 524 and 526 are coupled to the output of amplifier 532 through switch 540 while switches 101/521 and 102/522 alternate to charge/discharge integration capacitors 124 and 126.

Switches 525 and 540 are closed during the integration phase to keep $C_P$ 106 at $V_{REF}$. In this embodiment, one of switches 521 or 522 are closed, though only one is closed at a time. The output of op-amp 532 is coupled to the negative input of comparator 532, providing negative feedback for op-amp 532. The behavior of op-amp 532 may be referred to as a "virtual short" as both inputs of op-amp 532 are forced to the same voltage. Once the negative feedback is established through switches 540 and 521 or 522, the voltage on 105 (and on one plate of $C_M$ 104, $C_P$ 106, and integration capacitors 524 and 526) will be forced to $V_{REF}$. The output of op-amp 532 swings to compensate based on voltage on the capacitors.

In both initialization and digitization phase, 525 and 540 are open to keep 532 out/disconnected from the circuit. In other words, in initialization and digitization phases, the capacitance measurement circuit 500 is the same as capacitance measurement circuit 100 of FIG. 1.

During the digitization phase, the operation of the single-slope analog-to-digital conversion is similar as described with regard to mutual capacitance measurement circuit 100 of FIG. 1. Switch 542 is close to provide a ground connection to integration capacitors 524 and 526. Switch 537 is closed to charge integration capacitor 526 until comparator 530 trips and stops the timing from time measurement logic 540.

Figure 6:
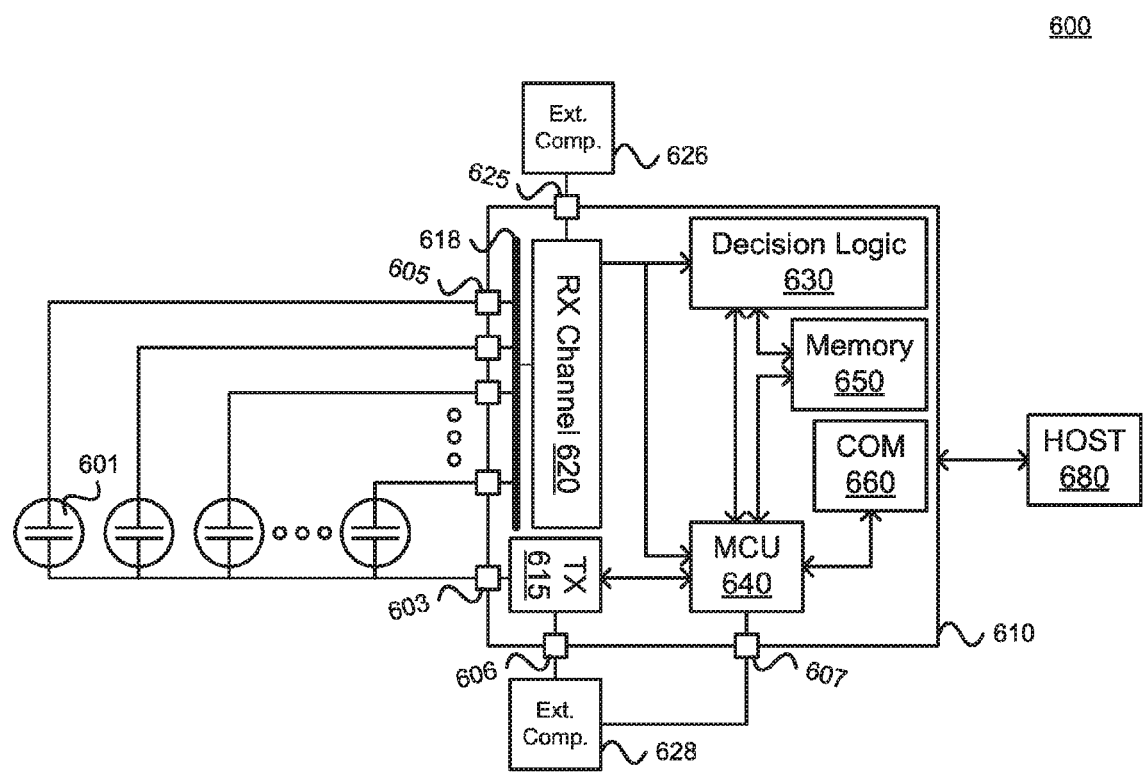
FIG. 6 illustrates a system including a capacitance measurement circuit, according to one embodiment

FIG. 6 illustrates a capacitance sensing system 600 that may incorporate the proposed quasi-differential mutual capacitance measurement circuit of the present application. System 600 may include at least mutual capacitance 601 coupled to a sensing circuit 610. In one embodiment, sensing circuit 610 may include circuitry integrated into a single device. In another embodiment, the various components of sensing circuit 610 may be distributed amongst several discrete components. For ease of explanation, sensing circuit 610 will be described as a single integrated circuit device. Mutual capacitance 601 may be coupled to sensing circuit 610 through inputs 605. Inputs 605 may be coupled to inputs of a receive channel 620 through multiplexor 618. Receive channel 620 may be configured to convert capacitance to a digital value, such as with the proposed quasi-differential capacitance measurement circuit. Receive channel 620 may be coupled to external components 626 as such may be necessary for the conversion, such as external integration capacitors 124 and 126 of FIG. 1. External components may be coupled to RX channel 620 through inputs 625. Additional external components may be coupled to transmit signal generator 615 and MCU 640. TX generator 615 may be configured to control switches 101 and 102 of FIG. 1 to provide the TX signal to the first electrode of mutual capacitances 601 ($C_M$ 104 of FIG. 1). External components may be coupled to sensing circuit 610 through inputs 606. Receive channel 620 may be coupled to decision logic 630 and to MCU 640.

Decision logic 630 may be configured to process the output of receive channel 620 to determine whether a change in digital values representative of capacitance is associated with a touch or other action. Decision logic 630 may also be configured to track baseline or background capacitance values for use in touch detection. MCU 640 may be used to configure receive channel 620 based on system or application requirements. The configuration of receive channel 620 and MCU 640 may be at startup, during runtime, or based on some interrupt of host-generated commands. MCU 640 may also be configured to execute functions similar to decision logic 630 and used to make decisions regarding the presence of an object on the capacitance sensing electrodes 601 or for baseline or background capacitance tracking. MCU 640 and decision logic 630 may be coupled to memory unit 650 for storing values associated with touch detection. Memory unit 650 may also store program files and commands that are executed by MCU 640. MCU 640 may also be coupled to external components, as necessary, through inputs 607. MCU 640 may also be coupled to communication interface 660, which may be used to output status to host 680 or another external device. Communication interface 660 may also be configured to receive commands from an external device.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   in an initialization phase, charging a first integration capacitor and a second integration capacitor to a first voltage;
   in an integration phase, providing negative charge packets to the first integration capacitor and positive charge packets to the second integration capacitor, wherein the negative and positive charge packets are derived from a mutual capacitance and a transmit (TX) signal applied to the mutual capacitance;
   in a digitization phase:
      initiating a timer of a time measurement logic block,
      charging the first integration capacitor until the voltage across the first integration capacitor is substantially equal to the voltage across the second integration capacitor, and
      stopping the timer of the time measurement logic block, wherein the value of the timer is representative of the mutual capacitance; and
   providing the output of the digitization phase to a processing unit.

2. The method of claim 1, wherein the TX signal is applied to the mutual capacitance by:
   coupling a first electrode of the mutual capacitance to a first voltage in a first switching phase;
   coupling the first electrode of the mutual capacitance to a second voltage in a second switching phase.

3. The method of claim 2, wherein the positive charge packets are provided to the second integration capacitor when the first electrode of the mutual capacitance is coupled to the first voltage, the positive charge packets provided as a current received on a second electrode of the mutual capacitance.

4. The method of claim 2, wherein the negative charge packets are provided to the first integration capacitor when the first electrode of the mutual capacitance is coupled to the second voltage, the positive charge packets provided as a current received on a second electrode of the mutual capacitance.

5. The method of claim 2, wherein the first voltage is a power supply voltage and the second voltage is a ground potential.

6. The method of claim 1, wherein the charging of the first integration capacitor is by a current digital-to-analog converter (IDAC) to provide a constant current to the first integration capacitor.

7. The method of claim 6, wherein the IDAC is programmable.

8. A mutual capacitance measurement circuit comprising:
a first integration capacitor coupled to a first input of a comparator;
a second integration capacitor coupled to a second input of a comparator;
a reference voltage operatively coupled to the first and second integration capacitors, the reference voltage for resetting a voltage on the first and second integration capacitors during an initialization phase;
a receive (RX) pin coupled to first electrode of a mutual capacitance, the RX pin for receiving positive and negative charge packets during an integration phase, the positive and negative charge packets applied to the second and first integration capacitors, respectively;
a first current source coupled to the first integration capacitors, the first current source for charging the first integration capacitor until the voltage on the first integration capacitor is substantially equal to the charge on the second capacitor during a digitization phase; and
time measurement logic coupled to and controlled an output of the comparator during the digitization phase, the output of the comparator derived from the voltages across the first and second integration capacitors, wherein an output of the time measurement logic is a digital value representative of the mutual capacitance.

9. The mutual capacitance measurement circuit of claim 8, wherein the mutual capacitance is formed between a second electrode coupled to a transmit (TX) signal generating circuit and the first electrode coupled to the RX pin.

10. The mutual capacitance measurement circuit of claim 8, wherein the RX pin is coupled to an analog multiplexor (AMUX), the AMUX for coupling at least one RX pin to an integration circuit including at least the first and second integration capacitors.

11. The mutual capacitance measurement circuit of claim 10, wherein the AMUX couples a plurality of RX pins to the integration circuit.

12. The mutual capacitance circuit of claim 8 further comprising an AND gate coupled to the output of the comparator, the AND gate for providing control signals to a switch that couples the first current source to the first integration capacitor and for providing control signals to the time measurement logic.

13. The mutual capacitance circuit of claim 8 further comprising a second current source coupled to the second integration capacitor, the second current source for providing a compensation signal to the second integration capacitor during the integration phase.

14. The mutual capacitance circuit of claim 13, wherein the compensation signal reduces the voltage on the second integration capacitor during the integration phase.

15. A mutual capacitance measurement system comprising:
at least one mutual capacitance comprising a first electrode and a second electrode;
a mutual capacitance measurement circuit comprising:
a transmit (TX) signal generator coupled to the first electrode,
an receive (RX) channel coupled to the second electrode,
an initialization circuit for applying a reference voltage to a first integration capacitor and a second integration capacitor,
an integration circuit for receiving charge packets from the at least one mutual capacitance and integrating them on the first and second integration capacitors;
a digitization circuit for converting voltages on the first and second integration capacitors to a digital value, the digital value representative of the capacitance value of the at least one mutual capacitance; and
decision logic coupled to the mutual capacitance measurement circuit, the decision logic for detecting the presence or absence of a conductive object on or in proximity to the at least one mutual capacitance.

16. The mutual capacitance measurement system of claim 15 further comprising:
a microcontroller for controlling switch activation of a plurality of switches for initialization, integration, and digitization;
a memory for storing program instructions for the microcontroller and an output of the decision logic; and
a communication block for communicating outputs of the mutual capacitance measurement system to an external device.

17. The mutual capacitance measurement system of claim 15, wherein the first and second integration capacitors are external to the mutual capacitance measurement circuit.

18. The mutual capacitance measurement system of claim 15, wherein the first and second integration capacitors are disposed on an integrated circuit including the mutual capacitance measurement circuit.

19. The mutual capacitance measurement system of claim 15, wherein the mutual capacitance measurement circuit further comprises a first and second compensation circuits coupled to the first and second integration circuits, respectively, the first and second compensation circuits for providing a compensation signal to offset the charge packets.

20. The mutual capacitance measurement system of claim 15, wherein the TX signal generator alternately couples the first electrode to a first voltage and a second voltage.

* * * * *